United States Patent
Akagi et al.

(10) Patent No.: US 9,954,073 B2
(45) Date of Patent: Apr. 24, 2018

(54) METHOD FOR MANUFACTURING SILICON CARBIDE SEMICONDUCTOR DEVICE

(71) Applicant: DENSO CORPORATION, Kariya, Aichi-pref. (JP)

(72) Inventors: Nozomu Akagi, Kariya (JP); Jun Sakakibara, Kariya (JP); Shoji Mizuno, Kariya (JP); Yuichi Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 10 days.

(21) Appl. No.: 15/113,484

(22) PCT Filed: Jan. 14, 2015

(86) PCT No.: PCT/JP2015/000124
§ 371 (c)(1),
(2) Date: Jul. 22, 2016

(87) PCT Pub. No.: WO2015/111387
PCT Pub. Date: Jul. 30, 2015

(65) Prior Publication Data
US 2017/0012109 A1    Jan. 12, 2017

(30) Foreign Application Priority Data

Jan. 24, 2014    (JP) ................. 2014-011642

(51) Int. Cl.
*H01L 29/66*    (2006.01)
*H01L 29/78*    (2006.01)
(Continued)

(52) U.S. Cl.
CPC .... *H01L 29/66068* (2013.01); *H01L 21/0465* (2013.01); *H01L 21/0475* (2013.01);
(Continued)

(58) Field of Classification Search
CPC ............. H01L 21/0465; H01L 21/0475; H01L 23/544; H01L 29/66068; H01L 29/0865;
(Continued)

(56) References Cited

U.S. PATENT DOCUMENTS 5,895,939 A    4/1999 Ueno
5,963,807 A    10/1999 Ueno
(Continued)

FOREIGN PATENT DOCUMENTS

JP    2009-170558 A    7/2009
JP    2010-258386 A    11/2010
(Continued)

*Primary Examiner* — Brigitte Paterson
(74) *Attorney, Agent, or Firm* — Posz Law Group, PLC

(57) ABSTRACT

A method for manufacturing a SiC semiconductor device includes: forming recesses to be separated from each other on a cross section in parallel to a surface of the substrate by partially removing a top portion of the drift layer with etching using a mask after arranging the mask on a front surface of a drift layer; forming electric field relaxation layers having the second conductivity type to be separated from each other on the cross section by ion-implanting a second conductivity type impurity on a bottom of each recess using the mask; and forming a channel layer by forming a second conductivity type layer on the front surface of the drift layer including a front surface of each electric field relaxation layer in a respective recess.

4 Claims, 9 Drawing Sheets

(51) Int. Cl.
*H01L 21/04* (2006.01)
*H01L 29/36* (2006.01)
*H01L 29/16* (2006.01)
*H01L 23/544* (2006.01)
*H01L 29/08* (2006.01)
*H01L 29/10* (2006.01)
*H01L 29/417* (2006.01)
*H01L 29/423* (2006.01)

(52) U.S. Cl.
CPC ........ *H01L 23/544* (2013.01); *H01L 29/0865* (2013.01); *H01L 29/1033* (2013.01); *H01L 29/1095* (2013.01); *H01L 29/1608* (2013.01); *H01L 29/36* (2013.01); *H01L 29/41741* (2013.01); *H01L 29/4236* (2013.01); *H01L 29/66734* (2013.01); *H01L 29/7813* (2013.01); *H01L 2223/54426* (2013.01); *H01L 2223/54453* (2013.01); *H01L 2924/0002* (2013.01)

(58) Field of Classification Search
CPC ............. H01L 29/1033; H01L 29/1095; H01L 29/1608; H01L 29/41741; H01L 29/4236; H01L 29/66734
See application file for complete search history.

(56) References Cited

U.S. PATENT DOCUMENTS

| | | | |
|---|---|---|---|
| 6,020,600 A | 2/2000 | Miyajima et al. | |
| 6,573,534 B1 | 6/2003 | Kumar et al. | |
| 2008/0203398 A1 | 8/2008 | Harris et al. | |
| 2009/0114969 A1 | 5/2009 | Suzuki et al. | |
| 2009/0146154 A1 | 6/2009 | Zhang et al. | |
| 2011/0024831 A1* | 2/2011 | Nakano | H01L 29/0623 257/330 |
| 2011/0250737 A1 | 10/2011 | Zhang et al. | |
| 2012/0074490 A1 | 3/2012 | Saitoh | |
| 2012/0074491 A1* | 3/2012 | Ohta | H01L 29/0634 257/334 |
| 2012/0235164 A1 | 9/2012 | Zhang et al. | |
| 2013/0001680 A1 | 1/2013 | Nakano | |

FOREIGN PATENT DOCUMENTS

| | | |
|---|---|---|
| JP | 2011-165777 A | 8/2011 |
| JP | 2013-214658 A | 10/2013 |

* cited by examiner

METHOD FOR MANUFACTURING SILICON CARBIDE SEMICONDUCTOR DEVICE

CROSS REFERENCE TO RELATED APPLICATIONS

This application is a U.S. national stage of International Application No. PCT/JP2015/000124 filed on Jan. 14, 2015 and is based on Japanese Patent Application No. 2014-11642 filed on Jan. 24, 2014, the disclosure of which is incorporated herein by reference.

TECHNICAL FIELD

The present disclosure relates to a method for manufacturing a silicon carbide (hereinafter, referred to as SiC) semiconductor device having a trench gate.

BACKGROUND ART

A SiC semiconductor device achieving high breakdown electric field intensity generates a high electric field due to the high breakdown electric field intensity. In a case where the SiC semiconductor device is provided with an element of a trench gate structure, a high electric field is generated particularly at a gate bottom. Accordingly, a gate oxide film has a high electric field applied thereto and has a shorter life. In order to prevent such a shorter life, a conventional art proposes a structure in which a p-type impurity layer serving as an electric field relaxation layer is provided adjacent to a trench having a trench gate so as to relax an electric field applied to the trench gate (see Patent Literature 1). Such a structure including an electric field relaxation layer near a trench has a lower electric field applied to a gate oxide film as the electric field relaxation layer has a larger depth, so that the gate oxide film is likely to have a longer life.

PRIOR ART LITERATURES

Patent Literature

Patent Literature 1: JP-H09-36359-A

SUMMARY OF INVENTION

Object to be Solved

However, in a case where an electric field diffusion layer is formed by ion implantation, ions reach only a limited level. There has thus been a technical problem that the electric field relaxation layer thus formed does not have a large depth. The electric field relaxation layer is configured to relax an electric field of a gate bottom as the electric field relaxation layer is disposed closer to a trench gate, whereas an electric current path is narrowed and on-resistance is increased if the electric field relaxation layer is too close to the gate. It is thus important to secure accuracy in alignment between the electric field relaxation layer and the gate. Nevertheless, a conventional technique requires many alignment tree steps and is thus difficult to secure accuracy. These technical problems will specifically be described below with reference to FIGS. 6A to 6D.

A SiC semiconductor device having a conventional trench gate structure has been manufactured in accordance with the following method. As illustrated in FIG. 6A, an $n^+$-type Sic buffer layer J2 made of SiC and an n-type drift layer J3 are initially formed on an $n^+$-type SiC substrate J1 in the mentioned order. An alignment key J4 configured by a recess is subsequently formed by etching at a region other than a cell region.

As illustrated in FIG. 6B, an oxide film J5 is then formed on the n-type drift layer J3 and is subsequently patterned with reference to the alignment key J4 to form a mask. P-type impurities are provided by ion implantation from over the oxide film J5 as the mask to form an electric field relaxation layer J6 in a top portion of the n-type drift layer J3. As illustrated in FIG. 6C, after the oxide film J5 is removed, a p-type channel layer J7 is epitaxially grown on the front surfaces of the n-type drift layer J3 and the electric field relaxation layer J6. As illustrated in FIG. 6D, the manufacturing method further includes the steps of forming an n-type source region 38 and a $p^+$-type body layer 39, forming a trench J10, forming a gate insulating film J11, forming a gate electrode J12, forming a source electrode J13 and a drain electrode J14, and the like. A SiC semiconductor device including a MOSFET of a trench gate structure is thus manufactured through these steps.

In such a manufacturing method, ion implantation needs to be performed with large acceleration energy in order to form the electric field relaxation layer J6 having a large depth by ion implantation. SiC hardly causes thermal diffusion of impurities. As in FIG. 7 illustrating an impurity concentration profile, impurities need to be implanted in multiple steps to continuously provide impurity layers.

However, increase in acceleration energy requires a large acceleration tube and there is limitation in size of a device. Furthermore, ions implanted with large acceleration energy generate SiC crystal defects. SiC is less likely to achieve recrystallization by high temperature annealing. It is thus preferred to reduce acceleration energy and minimize generation of crystal defects, and it is not preferred to increase acceleration energy. Increase in number of implantation steps causes increase in number of ion implantation steps as well as increase in manufacturing cost.

The electric field relaxation layer J6 exerts a higher electric field relaxation effect at the gate bottom as the electric field relaxation layer J6 is closer to the trench J10 provided with the trench gate. Meanwhile, the electric field relaxation layer J6 disposed too close to the trench J10 narrows a gap between the electric field relaxation layer J6 and the trench J10. The smaller gap narrows the electric current path provided therein and thus raises on-resistance. It is thus important to secure alignment accuracy between the electric field relaxation layer J6 and the trench J10.

In order for alignment between the electric field relaxation layer J6 and the trench gate, the recess is formed in the front surface of the n-type drift layer J3 to provide the alignment key J4 before the electric field relaxation layer J6 is formed. There are thus two alignment tree steps between the electric field relaxation layer J6 and the trench gate, with difficulty in securing accuracy. Specifically, the electric field relaxation layer J6 and the trench J10 are individually formed with reference to the alignment key J4, thereby to separately cause misalignment of the electric field relaxation layer J6 and misalignment of the trench J10. There is thus possibly caused two-step misalignment with difficulty in securing accuracy.

It is an object of the present disclosure to provide a method for manufacturing a SiC semiconductor device that does not require ion implantation with large acceleration energy.

Means for Achieving Object

According to an aspect of the present disclosure, a method for manufacturing a silicon carbide semiconductor device includes: forming, on a substrate made of silicon carbide and having a first conductivity type or a second conductivity type, a drift layer made of silicon carbide and having the first conductivity type with an impurity concentration lower than the substrate; forming a plurality of recesses to be separated from each other on a cross section in parallel to a surface of the substrate by partially removing a top portion of the drift layer with etching using a mask after arranging the mask on a front surface of the drift layer; forming a plurality of electric field relaxation layers having the second conductivity type to be separated from each other on the cross section by ion-implanting a second conductivity type impurity on a bottom of each recess using the mask; forming a channel layer by forming a second conductivity type layer on the front surface of the drift layer including a front surface of each electric field relaxation layer in a respective recess; forming a source region made of silicon carbide and having the first conductivity type with a concentration higher than the drift layer by ion-implanting a first conductivity type impurity on a top portion of the channel layer; forming a trench between the plurality of electric field relaxation layers, the trench penetrating from a front surface of the source region through the channel layer to reach the drift layer and having a depth shallower than the electric field relaxation layers; forming a gate insulating film on an inner surface of the trench; forming a gate electrode on the gate insulating film in the trench; forming a source electrode electrically connected to the source region and the channel layer; and forming a drain electrode on a rear surface of the substrate.

The manufacturing method described above includes forming the recesses in the front surface of the drift layer, and forming the electric field relaxation layers by ion implantation of the second conductivity type impurities to the bottoms of the recesses. The electric field relaxation layers are thus formed to a lower level with no need for ion implantation of large acceleration energy.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Preferred embodiments of the present disclosure will be described below with reference to the drawings. Throughout the embodiments described below, identical or equivalent portions will be denoted by identical reference signs.

First Embodiment

Figure 1:
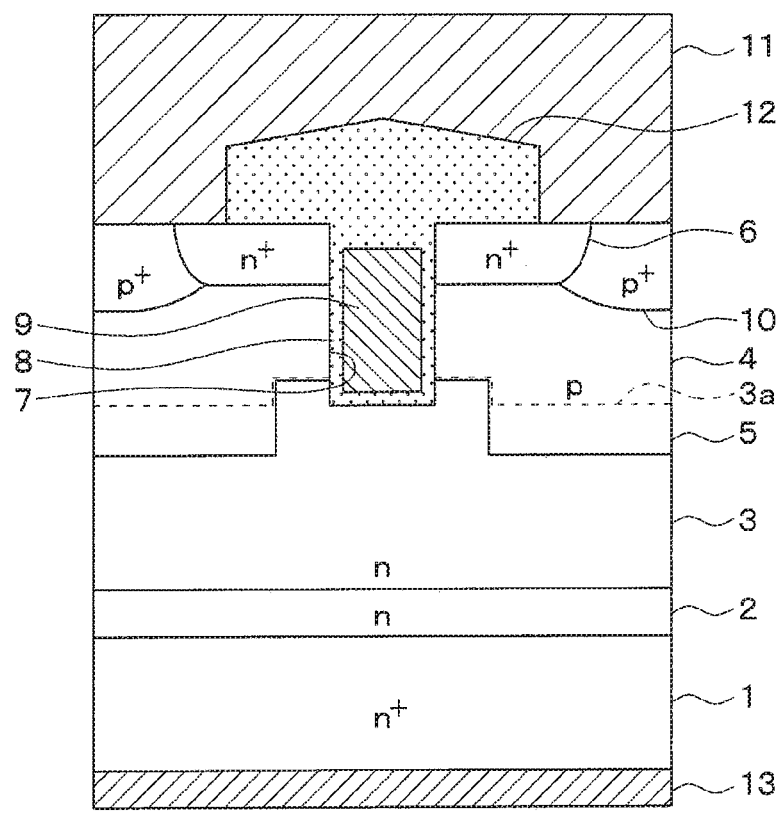
FIG. 1 is a sectional view of a SiC semiconductor device including a MOSFET of a trench gate structure according to a first embodiment of the present disclosure.

The first embodiment of the present disclosure will now be described. A structure of a SiC semiconductor device including a MOSFET of a reversed trench gate structure manufactured in accordance with a manufacturing method of the present embodiment will initially be described with reference to FIG. 1. FIG. 1 illustrates a single cell of the MOSFET. MOSFETs configured similarly to the MOSFET of FIG. 1 are disposed in a plurality of adjacent rows.

As illustrated in FIG. 1, an $n^+$-type SiC substrate 1 is made of a SiC monocrystal doped with n-type impurities (e.g. nitrogen) having a high concentration, and an n-type buffer layer 2 is made of SiC doped with n-type impurities and provided on the $n^+$-type SiC substrate 1. The n-type buffer layer 2 is provided thereon with an n-type drift layer 3 made of SiC doped with n-type impurities. The n-type buffer layer 2 has an n-type impurity concentration that is lower than that of the $n^+$-type SiC substrate 1 and is higher than that of the n-type drift layer 3. The n-type impurity concentration thus increases gradually from the n-type drift layer 3 to the $n^+$-type SiC substrate 1. Thickness of the n-type buffer layer 2 and the n-type drift layer 3, in particular the thickness of the n-type drift layer 3 is set in terms of designed pressure resistance. In the present embodiment, the thickness of the n-type buffer layer 2 is set to at most 1 μm, such as 0.5 µm, whereas the thickness of the n-type drift layer 3 is set to the range from 5 to 20 µm, such as 9.5 µm.

The n-type drift layer 3 is provided thereon with a p-type channel layer 4 made of SiC doped with p-type impurities (e.g. boron or aluminum). The n-type drift layer 3 is partially provided with a recess 3a. In the portion provided with the recess 3a, an electric field relaxation layer 5 made of SiC doped with p-type impurities is provided from a top portion of the n-type drift layer 3, specifically, a lower level than the bottom of the recess 3a, to a lower level than the front surface of the n-type drift layer 3 in the portion provided with no recess 3a.

The p-type channel layer 4 is 0.9 µm thick, for example. The electric field relaxation layer 5 is disposed on each side of a trench 7 included in the trench gate structure to be described later. The electric field relaxation layer 5 is provided so as to be distant by at least 0.2 µm from a side wall of the trench 7 for prevention of complete depletion in a case where a depleted layer expands, and so as to be distant by at most 1.0 µm from the side wall of the trench 7 for exertion of its electric field relaxing effect. For example, the electric field relaxation layer 5 and the side wall of the trench 7 are disposed so as to be distant from each other by 0.6 to 0.7 µm.

The bottom of the electric field relaxation layer 5 is lower than the bottom of the trench 7. The electric field relaxation layer 5 is provided to a position lower by at least 1.0 µm than the bottom of the trench 7 (closer to the n-type buffer layer 2). The bottom of the p-type channel layer 4 in a portion in contact with the trench 7 is distant by 0.2 µm or the like from the bottom of the trench 7, and is distant by at least 1.2 µm or the like from the bottom of the electric field relaxation layer 5.

The p-type channel layer 4 is provided, in a top portion, with an $n^+$-type source region 6 made of SiC doped with n-type impurities having a high concentration. The trench 7 of at least 1.1 µm deep or the like is provided so as to penetrate the p-type channel layer 4 and the $n^+$-type source region 6 and reach the n-type drift layer 3. The p-type channel layer 4 and the $n^+$-type source region 6 are disposed to be in contact with the side surfaces of the trench 7. The trench 7 has inner walls covered with a gate insulating film 8 configured by an oxide film or the like. The interior of the trench 7 is filled with a gate electrode 9 that is provided on the front surface of the gate insulating film 8 and made of doped Poly-Si. The trench gate structure thus includes the trench 7 provided therein with the gate insulating film 8 and the gate electrode 9.

Although not illustrated in FIG. 1, the trench gate structure has a rectangular shape with a longer side in the vertical direction or the like on the sheet. A plurality of trench gate structures are aligned in a stripe manner in the horizontal direction on the sheet at an equal interval so as to provide a structure having a plurality of cells.

A p-type body layer 10 also serving as a p-type contact region is provided in a center portion of the p-type channel layer 4 disposed between the adjacent trenches 7, in other words, on a side of the $n^+$-type source region 6 opposite to the side in contact with the trench 7.

The $n^+$-type source region 6 and the p-type body layer 10 are provided, on the front surfaces, with a source electrode 11. The source electrode 11 is made of a plurality of metals (e.g., Ni/Al). Specifically, the source electrode 11 has a portion that is connected to the $n^+$-type source region 6 and is made of a metal enabling ohmic contact with n-type SiC, and a portion that is connected to the p-type channel layer 4 via the p-type body layer 10 and is made of a metal enabling ohmic contact with p-type SiC. The source electrode 11 is provided on an interlayer insulating film 12 so as to be electrically isolated from gate wiring (not illustrated) which is electrically connected to the gate electrode 9. The source electrode 11 is in electrical contact with the $n^+$-type source region 6 and the p-type body layer 10 via a contact hole provided in the interlayer insulating film 12.

The $n^+$-type SiC substrate 1 is provided, on the rear surface, with a drain electrode 13 that is electrically connected to the $n^+$-type SiC substrate 1. An n-channel type MOSFET having the reversed trench gate structure is configured in this manner.

When gate voltage is applied to the gate electrode 9 in the MOSFET thus configured, portions of the p-type channel layer 4 in contact with the side surfaces of the trench 7 serve as reversed channels and allow electric current to flow between the source electrode 11 and the drain electrode 13.

High voltage approximately ten times that of a silicon device (e.g. 1200 V) is applied as drain voltage. This voltage causes an electric field approximately ten times that of the silicon device to be applied also to the gate insulating film 8. The electric field possibly concentrates at the gate insulating film 8 (particularly the gate insulating film 8 at the bottom of the trench 7). In this regard, the present embodiment adopts the structure including the electric field relaxation layer 5 that is provided to a lower level than the trench 7. Accordingly, a PN junction portion between the electric field relaxation layer 5 and the n-type drift layer 3 has a depleted layer greatly extending toward the n-type drift layer 3. High voltage due to drain voltage is thus less likely to enter the gate insulating film 8.

This configuration enables relaxation of electric field concentration in the gate insulating film 8, particularly electric field concentration in the gate insulating film 8 at the bottom of the trench 7. This configuration thus prevents breakdown of the gate insulating film 8.

A method for manufacturing the trench gate type MOSFET illustrated in FIG. 1 will be described next with reference to FIGS. 2A to 2E.

Figure 2A:
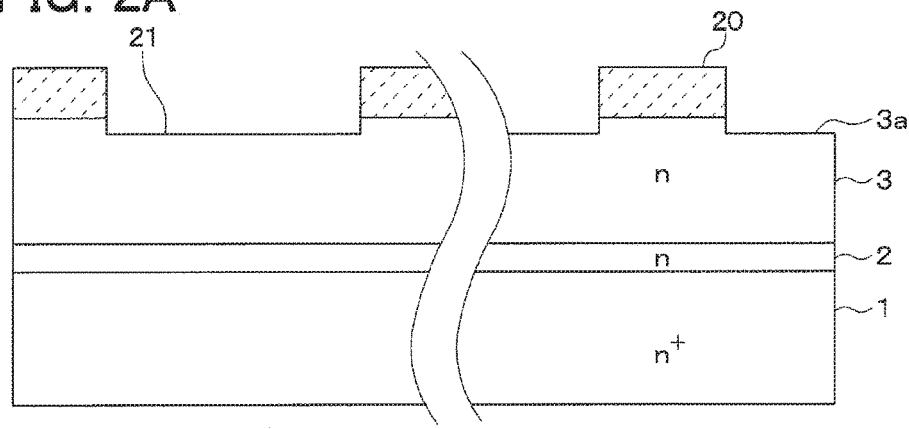
FIG. 2A is a sectional view of a state in a step in manufacture of the SiC semiconductor device of FIG. 1.

In the step of FIG. 2A, initially prepared is an $n^+$-type SiC substrate 1 made of a SiC monocrystal doped with n-type impurities at a high concentration. The n-type buffer layer 2 and the n-type drift layer 3 are epitaxially grown in the mentioned order on the front surface of the $n^+$-type SiC substrate 1. For example, the n-type buffer layer 2 and the n-type drift layer 3 are formed to be 0.5 µm thick and 9.5 µm thick, respectively. In this case, change in amount of n-type impurities introduced into an epitaxial growth system causes the n-type buffer layer 2 and the n-type drift layer 3 to have different impurity concentration values.

A mask material such as an oxide film is subsequently deposited on the n-type drift layer 3 and is then patterned to provide a mask 20 that has openings at regions to be provided with the electric field relaxation layer 5 and an alignment key 21. The region to be provided with the alignment key 21 is preferably positioned at a dicing region, a wafer outer edge, or the like, which is to be provided with no element, for example. Anisotropic etching such as reactive ion etching (RIE) is performed with use of the mask 20. A top portion of the n-type drift layer 3 is removed by about 0.2 to 1.0 µm in depth at the opening in the mask 20, to form the alignment key 21 configured by the recess 3a and a depression. The recess 3a and the alignment key 21 are formed simultaneously with use of the single mask 20. This method achieves formation of the recess 3a and the alignment key 21 with no misalignment.

Figure 2B:
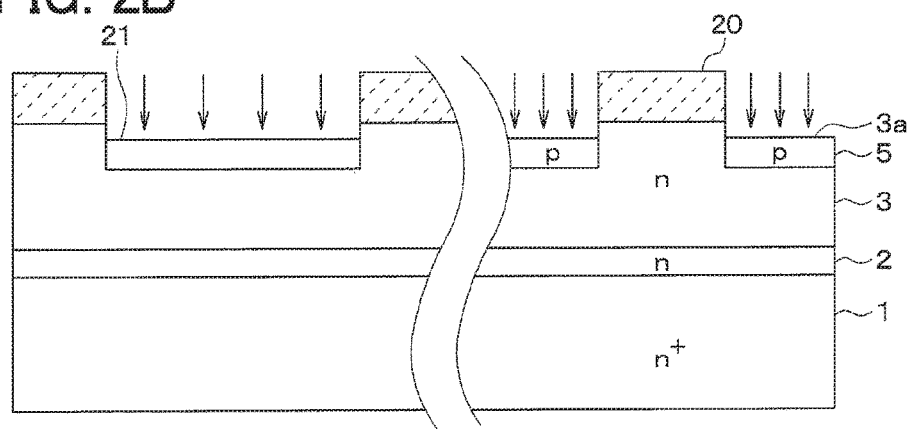
FIG. 2B is a sectional view of a state in a step subsequent to the step of FIG. 2A in the manufacture of the SiC semiconductor device.

In the step of FIG. 2B, p-type impurities are provided by ion implantation along a normal line of a substrate face with use of the same mask 20 that is used for formation of the recess 3a. The p-type impurities are thus doped to a portion from the bottom of the recess 3a to a lower level, so as to form the electric field relaxation layer 5. Provision of the recess 3a achieves a long distance from the bottom of the p-type channel layer 4 in the portion not provided with the recess 3a to the bottom of the electric field relaxation layer 5. The bottom of the electric field relaxation layer 5 is thus provided at a lower level even with no use of any ion implantation device having an acceleration tube configured to generate large acceleration energy.

The mask 20 used for formation of the recess 3a is also used as a mask for ion implantation. The mask 20, which serves as an etching mask for formation of the recess 3a and an ion implantation mask, simplifies the manufacturing steps as well as prevents misalignment between the recess 3a and the electric field relaxation layer 5 due to mask misalignment.

Figure 2C:
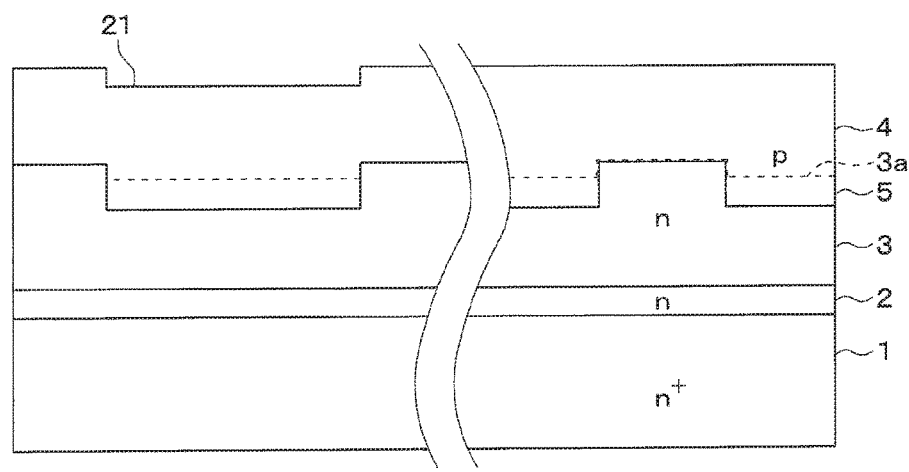
FIG. 2C is a sectional view of a state in a step subsequent to the step of FIG. 2B in the manufacture of the SiC semiconductor device.

In the step of FIG. 2C, after the mask 20 is removed, the p-type channel layer 4 is epitaxially grown on the front surface of the electric field relaxation layer 5 provided at the bottom of the recess 3a and on the front surface of the n-type drift layer 3. The p-type channel layer 4 and the electric field relaxation layer 5 thus become connected with each other. An epitaxial growth rate is adjusted to cause a portion of the p-type channel layer 4 provided on the front surface of the electric field relaxation layer 5 to be flush with a portion of the p-type channel layer 4 provided on the front surface of a portion between the recesses 3a distant from each other in the n-type drift layer 3.

The p-type channel layer 4 is to be formed also on the alignment key 21 at this stage. However, the depression of the alignment key 21 remains when the alignment key 21 is larger in width (opening area) than the recess 3a. The remaining depression serves as another alignment key 21.

Figure 2D:
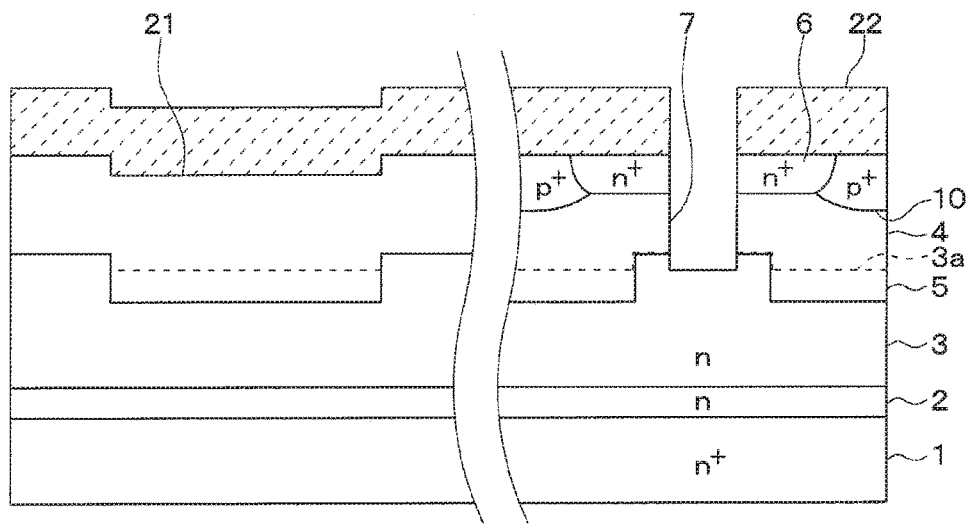
FIG. 2D is a sectional view of a state in a step subsequent to the step of FIG. 2C in the manufacture of the SiC semiconductor device.

In the step of FIG. 2D, the p-type channel layer 4 is initially provided on the front surface with a mask (not illustrated) having an opening at a region to be provided with the $n^+$-type source region 6. N-type impurities having a high concentration are then provided by ion implantation from over the mask to form the $n^+$-type source region 6. Similarly, the p-type channel layer 4 is provided on the front surface with a mask (not illustrated) having an opening at a region to be provided with the p-type body layer 10. P-type impurities having a high concentration are then provided by ion implantation from over the mask to form the p-type body layer 10.

Subsequently, an etching mask 22 having an opening at a region to be provided with the trench 7 is disposed to cover exposed portions in the front surfaces of the $n^+$-type source region 6, the p-type body layer 10, and the p-type channel layer 4. Anisotropic etching is performed with use of the etching mask 22, and isotropic etching and sacrificial oxidation are then performed as necessary to form the trench 7. The trench 7 is formed to be at least 1.1 µm deep, for example. The trench 7 is thus provided to reach the n-type drift layer 3 through the p-type channel layer 4 and the $n^+$-type source region 6 as well as to be disposed between the adjacent electric field relaxation layers 5 and be distant from the electric field relaxation layers 5.

The etching mask 22 is patterned with reference to the alignment key 21. The alignment key 21 is provided with no misalignment with respect to the recess 3a, thereby causing only single-step misalignment of the opening in the etching mask 22. Aligning the etching mask 22 with reference to the alignment key 21 corresponds to aligning the etching mask 22 with reference to the recess 3a. Accordingly, there is caused only one-step misalignment. Alignment accuracy is thus secured between the trench 7 and the electric field relaxation layer 5.

Figure 2E:
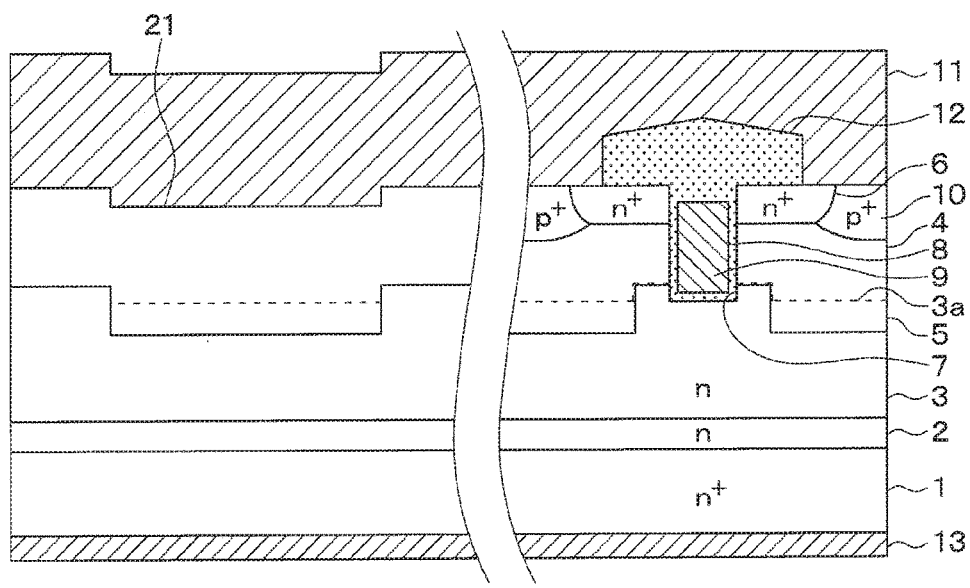
FIG. 2E is a sectional view of a state in a step subsequent to the step of FIG. 2D in the manufacture of the SiC semiconductor device.

In the step of FIG. 2E, the etching mask 22 is removed and gate oxidation is then performed to form the gate insulating film 8. A polysilicon layer doped with impurities is formed on the front surface of the gate insulating film 8 and is then patterned to form the gate electrode 9. The trench gate structure is thus provided.

The interlayer insulating film 12 is formed and then patterned to form a contact hole connecting to the $n^+$-type source region 6 and the p-type body layer 10 as well as to form a contact hole connecting to the gate electrode 9 in different sections. Subsequently, an electrode material film is formed so as to fill the contact hole and is then patterned. There are thus formed the source electrode 11 and gate wiring (not illustrated). The drain electrode 13 is formed on the rear surface of the $n^+$-type SiC substrate 1 to complete the MOSFET illustrated in FIG. 1.

According to the present embodiment described above, the recess 3a is formed in the front surface of the n-type drift layer 3 and the electric field relaxation layer 5 is formed by ion implantation of p-type impurities to the bottom of the recess 3a. The electric field relaxation layer 5 is thus formed to a lower level with no need for ion implantation of large acceleration energy.

The alignment key 21 is formed simultaneously with the recess 3a, and the etching mask 22 used for formation of the trench 7 is formed with use of the alignment key 21. Alignment accuracy is thus secured between the trench 7 and the electric field relaxation layer 5.

Accordingly, the method for manufacturing the SiC semiconductor device thus requires no ion implantation with large acceleration energy and secures alignment accuracy between the trench gate and the electric field relaxation layer 5.

Figure 3:
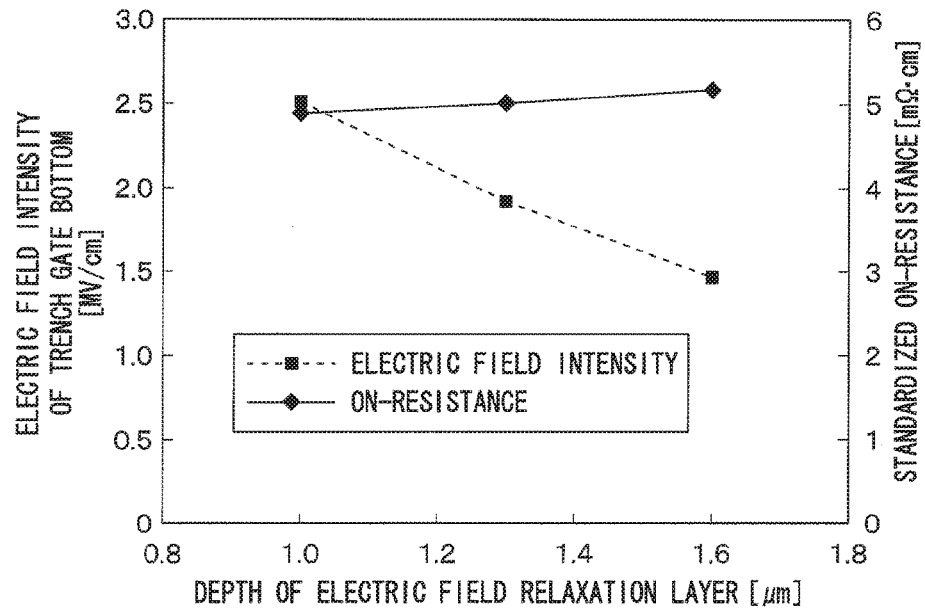
FIG. 3 is a graph indicating measurement results of electric field intensity and standardized on-resistance of a trench gate bottom of the SiC semiconductor device of FIG. 1.

FIG. 3 indicates measurement results of electric field intensity and standardized on-resistance of the trench gate bottom in the SiC semiconductor device illustrated in FIG. 1 in a case where drain-source voltage is 1200 V. Specifically, FIG. 3 indicates measurement results of a case where the side wall of the trench 7 and the electric field relaxation layer 5 have a constant distance therebetween and the bottom of the p-type channel layer 4 in the portion in contact with the trench 7 and the bottom of the electric field relaxation layer 5 have a varied distance therebetween. As indicated in this graph, the trench gate bottom has weaker electric field intensity as the distance from the bottom of the p-type channel layer 4 in the portion in contact with the trench 7 to the bottom of the electric field relaxation layer 5 is longer, in other words, as the electric field relaxation layer 5 has a larger depth. In contrast, the standardized on-resistance keeps a desired value even in the case where the distance from the bottom of the p-type channel layer 4 in the portion in contact with the trench 7 to the bottom of the electric field relaxation layer 5 increases. The electric field relaxation layer 5 is thus allowed to have the bottom at a lower level as in the present embodiment, so that the effect described above is achieved.

Second Embodiment

The second embodiment of the present disclosure will now be described. The present embodiment is similar to the first embodiment except that the shapes of the $n^+$-type source region 6 and the like are changed from those of the first embodiment. The following description refers only to features different from the first embodiment.

Figure 4:
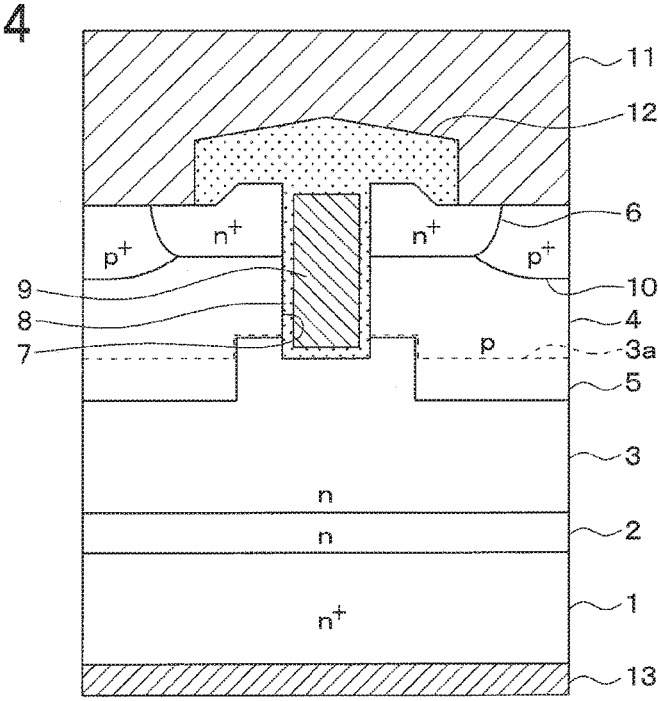
FIG. 4 is a sectional view of a SiC semiconductor device including a MOSFET of a trench gate structure according to a second embodiment of the present disclosure.

As illustrated in FIG. 4, in a SiC semiconductor device manufactured in accordance with a manufacturing method of the present embodiment, the n$^+$-type source region 6 partially projects in a range of a predetermined distance from the side wall of the trench 7, specifically, in a region corresponding to the portion not provided with the recess 3a. Furthermore, the p-type body layer 10 is provided at a lower level than the projecting portion of the n$^+$-type source region 6.

Figure 5A:
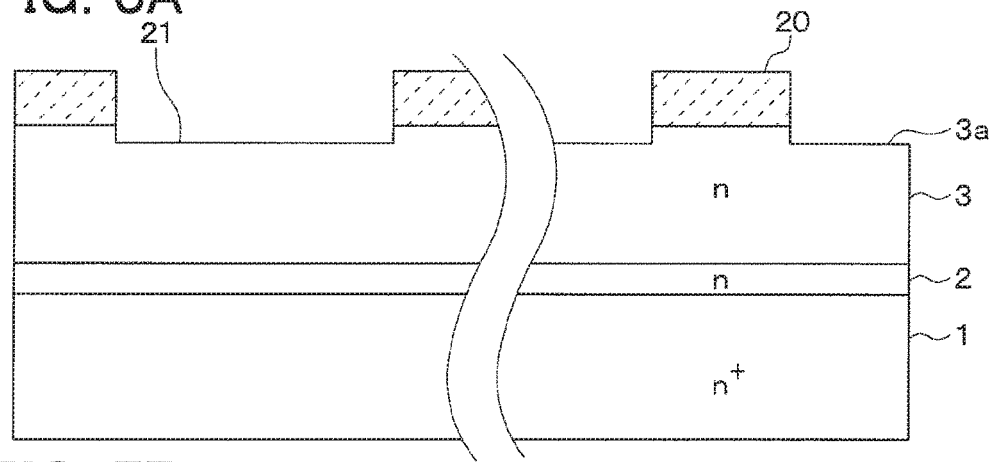
FIG. 5A is a sectional view of a state in a step in manufacture of the SiC semiconductor device of FIG. 4.
Figure 5B:
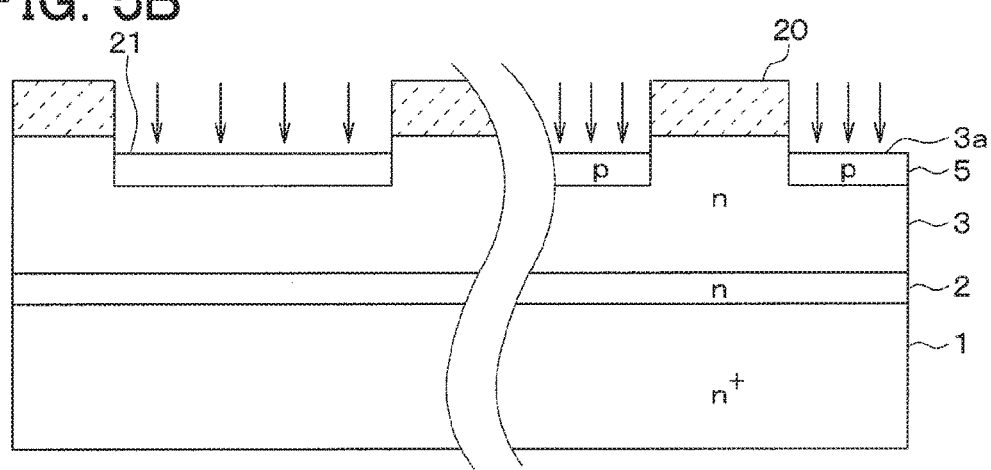
FIG. 5B is a sectional view of a state in a step subsequent to the step of FIG. 5A in the manufacture of the SiC semiconductor device.
Figure 5C:
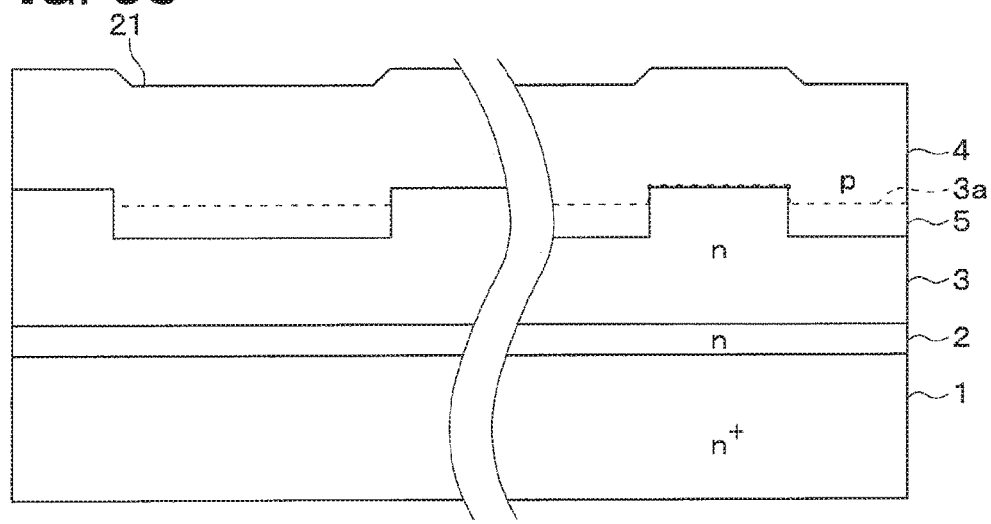
FIG. 5C is a sectional view of a state in a step subsequent to the step of FIG. 5B in the manufacture of the SiC semiconductor device.
Figure 5D:
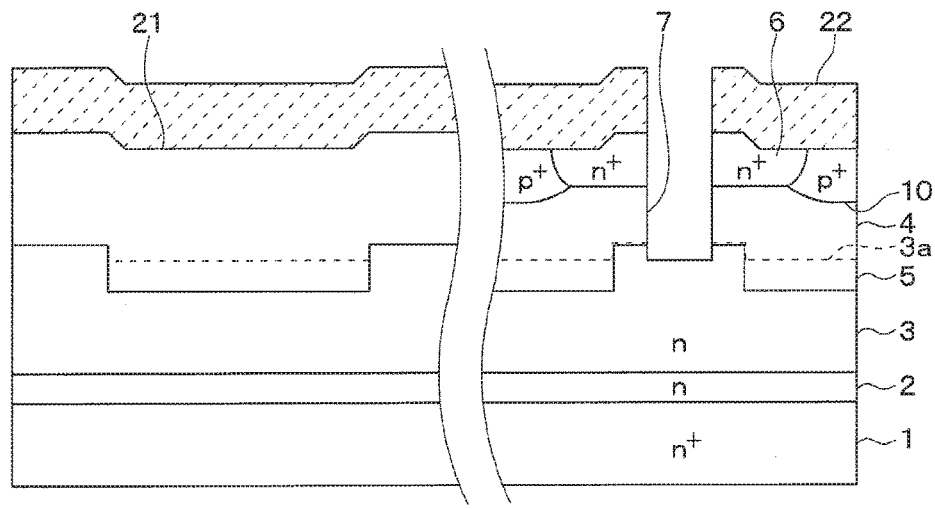
FIG. 5D is a sectional view of a state in a step subsequent to the step of FIG. 5C in the manufacture of the SiC semiconductor device.
Figure 5E:
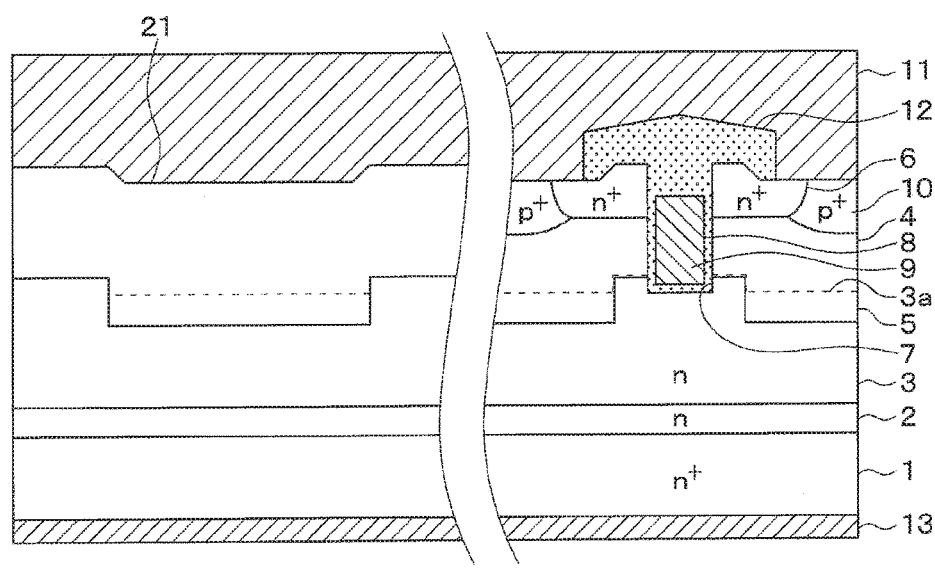
FIG. 5E is a sectional view of a state in a step subsequent to the step of FIG. 5D in the manufacture of the SiC semiconductor device.
Figure 6A:
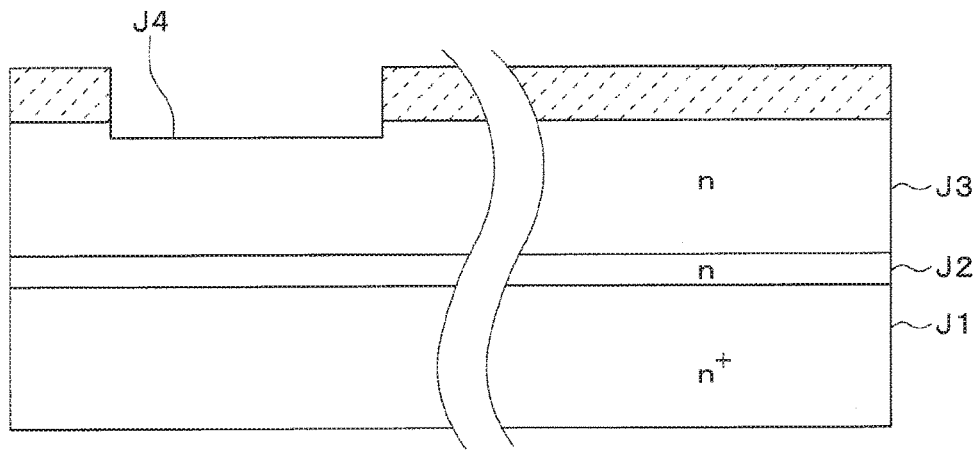
FIG. 6A is a sectional view of a state in a step in manufacture of a SiC semiconductor device including a conventional trench gate type MOSFET.
Figure 6B:
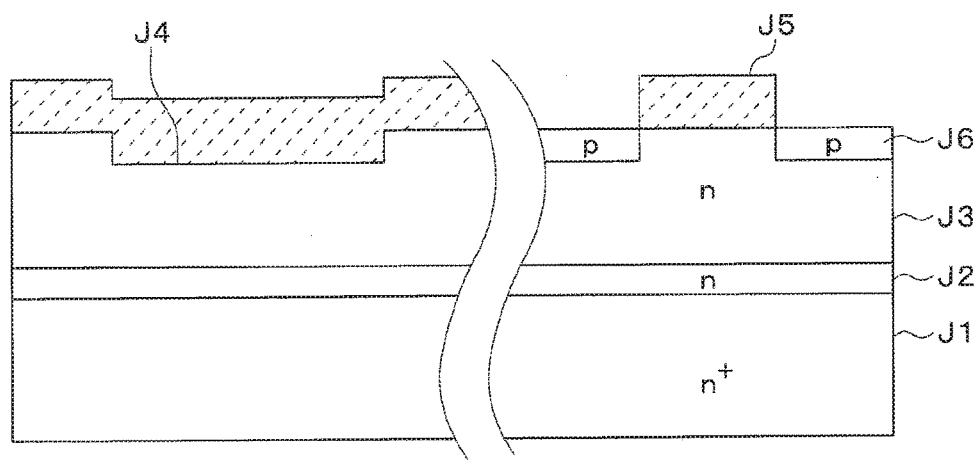
FIG. 6B is a sectional view of a state in a step subsequent to the step of FIG. 6A in the manufacture of the SiC semiconductor device.
Figure 6C:
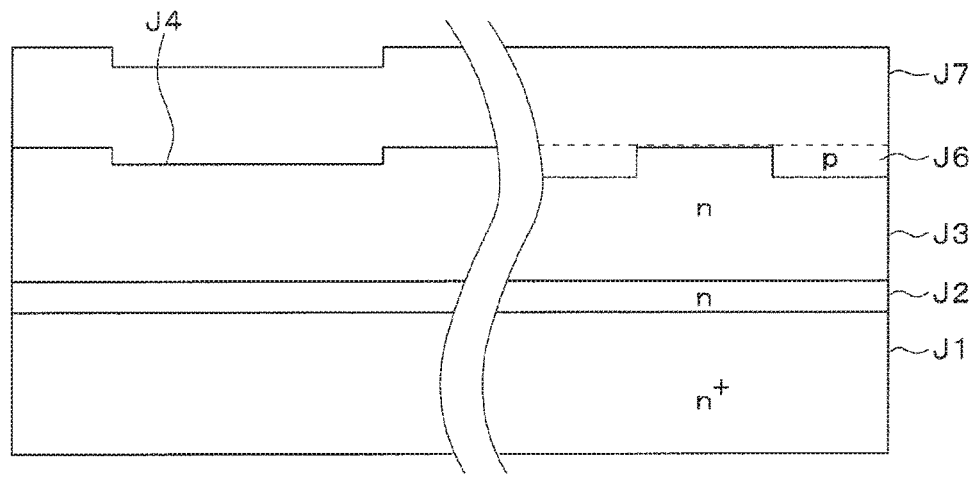
FIG. 6C is a sectional view of a state in a step subsequent to the step of FIG. 6B in the manufacture of the SiC semiconductor device.
Figure 6D:
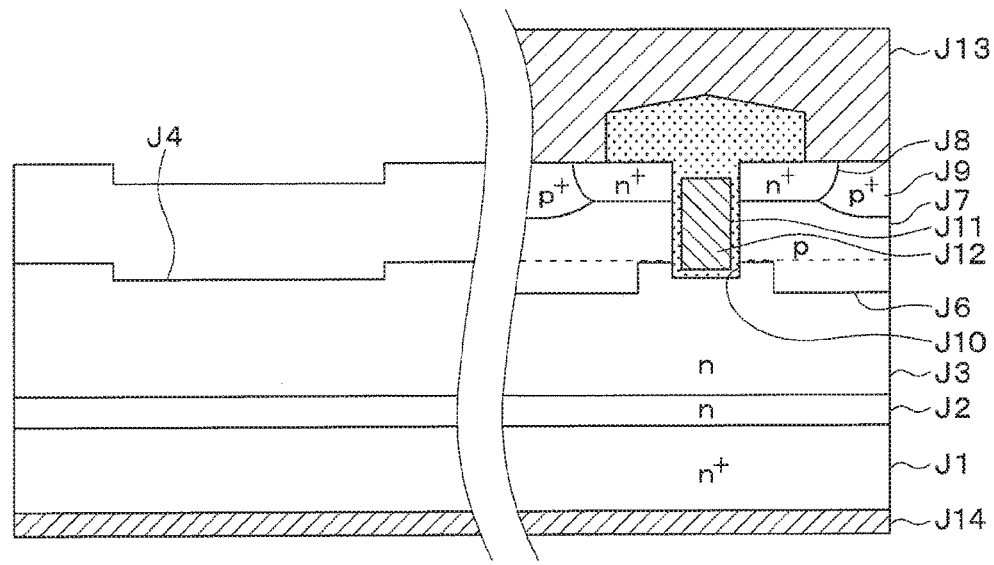
FIG. 6D is a sectional view of a state in a step subsequent to the step of FIG. 6C in the manufacture of the SiC semiconductor device.
Figure 7:
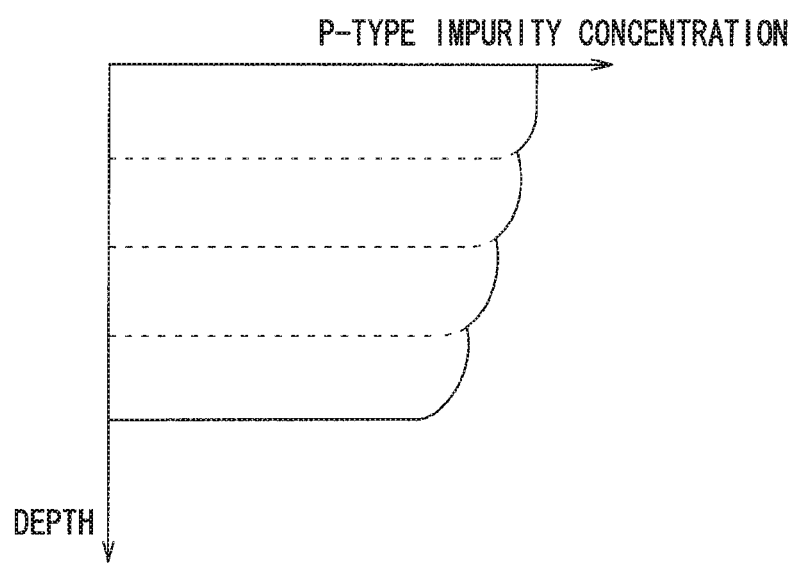
FIG. 7 is a view illustrating an impurity concentration profile along a depth of an electric field relaxation layer.

Specifically, the SiC semiconductor device according to the present embodiment is manufactured through the steps of FIGS. 5A to 5E similar to those of FIGS. 2A to 2E according to the first embodiment. In the step of FIG. 5C, the p-type channel layer 4 is epitaxially grown so as to follow a level difference of the recess 3a, in other words, so as to keep the level difference. Accordingly, in the step of FIG. 5D, the n$^+$-type source region 6 partially projects upon ion implantation of n-type impurities, and the p-type body layer 10 is formed to a lower level by ion implantation of p-type impurities.

The distance from the side wall of the trench 7 configuring the trench gate structure to the p-type body layer 10 is thus shorter than that in the structure according to the first embodiment. Accordingly, back gate resistance in FIG. 4 is made smaller, so that the MOSFET has a stable threshold and parasitic operation is restrained.

In order to flatten the front surface of an epitaxial film after filling the level difference and accumulation in epitaxial growth, the epitaxial growth rate typically needs to be decreased for leveling the difference in thickness of the epitaxial film due to the level difference. In contrast, in the case where the p-type channel layer 4 is formed so as to follow the level difference of the recess 3a as in the present embodiment, the p-type channel layer 4 is formed to have uniform thickness with no need for leveling a difference in film thickness. There is thus no need to decrease the epitaxial growth rate. This restrains decrease in throughput and accordingly enables manufacture of the SiC semiconductor device at a lower cost.

Other Embodiments

The present disclosure should not be limited to the embodiments described above, but can be modified where appropriate.

For example, the above embodiments relate to the case where the recess 3a has side walls vertical to the substrate face. The side walls are alternatively slanted to have tapered faces. In this case, the p-type channel layer 4 to be formed thereon will easily fill the recess 3a with higher embedability. Furthermore, instead of forming by etching once, etching is alternatively be performed a plurality of times to form the recess 3a having stepped side walls.

The above embodiments adopt the structure in which the plurality of electric field relaxation layers 5 are distant from each other on a section illustrated in FIGS. 1 and 4, that is, a section in parallel with the substrate face. This indicates that the electric field relaxation layers 5 have only to be separated from each other at least on the section illustrated in FIGS. 1 and 4 and may be partially connected to each other in a different section. In an exemplary case where the trench gate structures are aligned in a stripe manner and extend perpendicularly on the sheet, the electric field relaxation layers 5 are separated as a plurality of portions.

Meanwhile, in a case where the trench gate structure has a quadrilateral shape or the like and is surrounded with the electric field relaxation layer 5, or in a case where the trenches 7 are aligned in a stripe manner but the electric field relaxation layers 5 are aligned in a lattice manner, the electric field relaxation layers 5 are partially connected to each other on a section not illustrated in FIGS. 1 and 4.

The above embodiments each exemplify the n-channel type MOSFET with the first conductivity type set to the n-type and the second conductivity type set to the p-type. The present disclosure is also applicable to a p-channel type MOSFET including the components of the reversed conductivity types. Furthermore, the present disclosure is applicable to an IGBT as well as to a MOSFET. An IGBT includes a SiC substrate of the second conductivity type replaced with the first conductivity type of a MOSFET, and other components of the conductivity types same as those of the MOSFET.

The invention claimed is:

1. A method for manufacturing a silicon carbide semiconductor device comprising:
    forming, on a substrate made of silicon carbide and having a first conductivity type or a second conductivity type, a drift layer made of silicon carbide and having the first conductivity type with an impurity concentration lower than the substrate;
    forming a plurality of recesses that are separated from each other along a surface of the substrate by partially removing a top portion of the drift layer with etching using a mask after arranging the mask on a front surface of the drift layer;
    forming a plurality of electric field relaxation layers, having the second conductivity type that are separated from each other, by ion-implanting a second conductivity type impurity into a bottom of each etched recess of the plurality of recesses using the mask;
    forming a channel layer of a second conductivity type layer by epitaxially growing the channel layer both directly on a front surface of the drift layer and directly on a front surface of each electric field relaxation layer of the plurality of electric field relaxation layers within each bottom of each etched recess of the plurality of recesses wherein each etched recess is filled with the channel layer on each electric field relaxation layer, the plurality of electric field relaxation layers, being formed by implanting ions, remaining disposed below the channel layer in each recess of the plurality of recesses and the channel layer being electrically connected to each electric field relaxation layer of the plurality of electric field relaxation layers;
    forming a source region made of silicon carbide and having the first conductivity type with a concentration higher than the drift layer by ion-implanting a first conductivity type impurity on a top portion of the channel layer; forming a trench between the electric field relaxation layers, the trench penetrating from a front surface of the source region through the channel layer to reach the drift layer and having a depth shallower than the electric field relaxation layers; forming a gate insulating film on an inner surface of the trench; forming a gate electrode on the gate insulating film in the trench; forming a source electrode electrically connected to the source region and the channel layer; and forming a drain electrode on a rear surface of the substrate.

2. The method for manufacturing the silicon carbide semiconductor device according to claim 1, wherein:

in the forming of the plurality of recesses, an alignment key configured by a depression is formed at a portion of the drift layer other than the recesses.

3. The method for manufacturing the silicon carbide semiconductor device according to claim 2, wherein:
in the forming of the channel layer, a first portion of the channel layer formed on each of the electric field relaxation layers and a second portion of the channel layer formed between the plurality of electric field relaxation layers are flat, and a third portion of the channel layer is formed on the alignment key and retains the depression.

4. The method for manufacturing the silicon carbide semiconductor device according to claim 2, wherein:
in the forming of the channel layer, a first portion of the channel layer formed on each of the electric field relaxation layers is concaved to be lower than a second portion of the channel layer formed between the electric field relaxation layers to be separated from each other on the cross section, and a third portion of the channel layer is formed on the alignment key and retains the depression.

\* \* \* \* \*